US012578235B2

(12) United States Patent
Arens et al.

(10) Patent No.: US 12,578,235 B2
(45) Date of Patent: Mar. 17, 2026

(54) POWER SEMICONDUCTOR CIRCUIT AND METHOD FOR DETERMINING A TEMPERATURE OF A POWER SEMICONDUCTOR COMPONENT

(71) Applicant: Infineon Technologies AG, Neubiberg (DE)

(72) Inventors: Andre Arens, Ruethen (DE); Waldemar Jakobi, Soest (DE)

(73) Assignee: Infineon Technologies AG, Neubiberg (DE)

( * ) Notice: Subject to any disclaimer, the term of this patent is extended or adjusted under 35 U.S.C. 154(b) by 1911 days.

(21) Appl. No.: 16/535,381

(22) Filed: Aug. 8, 2019

(65) Prior Publication Data

US 2020/0049569 A1 Feb. 13, 2020

(30) Foreign Application Priority Data

Aug. 9, 2018 (EP) ..................................... 18188227

(51) Int. Cl.
 *G01K 7/01* (2006.01)
 *G01K 7/20* (2006.01)
 (Continued)

(52) U.S. Cl.
 CPC ................. *G01K 7/01* (2013.01); *G01K 7/20* (2013.01); *G01R 19/14* (2013.01); (Continued)

(58) Field of Classification Search
 CPC . G01K 7/01; G01K 7/015; G01K 7/20; G01R 19/14; G01R 31/2619; G01R 31/2628; H03K 17/08128; H03K 17/0828
 See application file for complete search history.

(56) References Cited

U.S. PATENT DOCUMENTS 6,995,555 B2 2/2006 Graf
2002/0158654 A1* 10/2002 Graf ................... G01R 19/0092
324/762.07

(Continued)

FOREIGN PATENT DOCUMENTS

CN 201583626 U 9/2010
CN 104601019 A 5/2015
(Continued)

OTHER PUBLICATIONS

Ruguan, Li, et al., "Progress of technologies and applications of temperature measurements for GaN-based HEMTs", Electronic components and materials, vol. 36, No. 9, Aug. 31, 2017, 1-9 (with English Abstract).

*Primary Examiner* — Patrick C Chen
(74) *Attorney, Agent, or Firm* — Murphy, Bilak & Homiller, PLLC

(57) ABSTRACT

A power semiconductor circuit includes: a power semiconductor element having a gate electrode configured to actuate the power semiconductor element, a collector electrode, and an emitter electrode electrically connected to a first emitter terminal; and a temperature sensor having a first measurement point with a measurement terminal and a second measurement point electrically connected to the emitter electrode, so that a voltage which drops over the temperature sensor is measurable between the measurement terminal and the first emitter terminal for the temperature measurement. Corresponding methods for determining a temperature of a power semiconductor element and for determining a sign of a load current in a bridge circuit are also described.

5 Claims, 7 Drawing Sheets

(51) Int. Cl.

| | |
|---|---|
| *G01R 19/14* | (2006.01) |
| *G01R 31/26* | (2020.01) |
| *H01L 23/00* | (2006.01) |
| *H01L 23/34* | (2006.01) |
| *H01L 25/18* | (2023.01) |
| *H03K 17/0812* | (2006.01) |
| *H03K 17/082* | (2006.01) |
| *H10D 12/00* | (2025.01) |
| *H10D 48/00* | (2025.01) |
| *H03K 17/08* | (2006.01) |

(52) U.S. Cl.
CPC ..... *G01R 31/2619* (2013.01); *G01R 31/2628* (2013.01); *H01L 23/34* (2013.01); *H01L 24/48* (2013.01); *H01L 25/18* (2013.01); *H03K 17/08128* (2013.01); *H03K 17/0828* (2013.01); *H10D 12/411* (2025.01); *H10D 48/387* (2025.01); *H03K 2017/0806* (2013.01); *H03K 17/08122* (2013.01); *H03K 2217/0027* (2013.01)

(56) References Cited

U.S. PATENT DOCUMENTS

| | | | |
|---|---|---|---|
| 2005/0104151 | A1 | 5/2005 | Wachi et al. |
| 2007/0176626 | A1* | 8/2007 | Bayerer ................... H01L 24/34 |
| | | | 257/E23.08 |
| 2009/0212284 | A1* | 8/2009 | Otremba ................. H01L 24/49 |
| | | | 257/735 |
| 2012/0175780 | A1* | 7/2012 | Baginski ................. H01L 23/34 |
| | | | 257/773 |
| 2016/0365294 | A1* | 12/2016 | Mori ........................ H01L 22/30 |
| 2018/0062499 | A1* | 3/2018 | Yamamoto ............ F02P 3/0435 |
| 2018/0166436 | A1* | 6/2018 | Sato .................... H01L 27/0248 |
| 2019/0131964 | A1* | 5/2019 | Bryant ................. H03K 17/082 |

FOREIGN PATENT DOCUMENTS

| | | |
|---|---|---|
| CN | 105258817 A | 1/2016 |
| EP | 1830405 A1 | 9/2007 |
| EP | 2444817 A2 | 4/2012 |
| GB | 2549934 A | 11/2017 |
| JP | 2001085629 A | 3/2001 |
| WO | 2005031750 A1 | 4/2005 |

* cited by examiner

POWER SEMICONDUCTOR CIRCUIT AND METHOD FOR DETERMINING A TEMPERATURE OF A POWER SEMICONDUCTOR COMPONENT

TECHNICAL FIELD

The present invention relates to a power semiconductor circuit for determining a temperature and optionally a current, comprising a power semiconductor element and a temperature sensor, wherein the power semiconductor element comprises a gate electrode for actuating the power semiconductor element, a collector electrode, and an emitter electrode, wherein the emitter electrode is electrically connected to a first emitter terminal and the temperature sensor has a first measurement point with a measurement terminal and a second measurement point.

BACKGROUND

Insulated-gate bipolar transistors (IGBT) are semiconductor components which are used in power electronics (herein also designated as power semiconductor components). Such semiconductor components are exposed to high temperatures and high current flows, which possibly result in damage to the point of destruction of the semiconductor components.

In order to protect the semiconductor components from high temperatures, temperature sensors are used. In this case, frequently a separate temperature sensor in the form of a separate chip is used, which is mounted on the housing or the heat sink of the semiconductor component. In this case, it is disadvantageous that the temperature is not measured inside the semiconductor component, where the temperature is highest. That is, the temperature of the semiconductor component is not measured directly here but merely the temperature of the housing in communication with it or a printed circuit board or base plate.

Thus, temperature sensors which are arranged inside a module next to the chip of an IGBT are also used. In this case, the temperature sensor is galvanically separated from the electronics of the IGBT. A disadvantage with such an arrangement is the increased space requirement and therefore possibly a reduced area available for the actual semiconductor component.

Also known are IGBTs with integrated excess current measurement to determine an excess current. Temperature-current-sense (TCS) IGBTs usually place $\frac{1}{2000}$ to $\frac{1}{1000}$ of the IGBT cells onto a separate terminal, which for normal-conducting n-channel transistors is the emitter electrode. A measurement resistance between the emitter electrode and an auxiliary emitter terminal produces a voltage drop in the conducting state of the IGBT, which is measured and evaluated to determine an excess current. A disadvantage with this arrangement is that a portion of the cells of the IGBT are used for current measurement and thus are not available for the actual task of the IGBT. Furthermore, additional space in the module is required for the terminal. The measurement resistance is usually located on a superordinate printed circuit board or board.

A conventional TCS-IGBT thus has two measurement branches, a first for the temperature measurement and a second for the current measurement. This also results in an increased space requirement of the TCS-IGBT and an increased number of terminals.

SUMMARY

It is therefore the object of the invention to provide an improved power semiconductor circuit for determining at least one excess temperature, which eliminates the disadvantages of conventional approaches and thus results in a space-saving dimensioning of a power semiconductor and a reduced number of terminals. Furthermore, it is the object of the invention to specify a method for determining a temperature of a power semiconductor element by means of a power semiconductor circuit.

It should be pointed out that the features listed individually in the following description can be combined with one another in an arbitrary, technically meaningful manner and show further embodiments of the invention. The description additionally characterizes and specifies the invention in particular in connection with the figures.

It should further be noted that a conjunction "and/or" used herein between two features and linking these to one another should always be interpreted such that in a first embodiment of the inventive subject matter, only the first feature can be present, in a second embodiment only the second feature can be present, and in a third embodiment both the first and the second feature can be present.

A power semiconductor circuit for determining a temperature, in particular excess temperature, of a power semiconductor element, comprises according to the invention the power semiconductor element and a temperature sensor, wherein the power semiconductor element comprises a gate electrode for actuating the power semiconductor element, a collector electrode, and an emitter electrode, wherein the emitter electrode is electrically connected to a first emitter terminal and the temperature sensor has a first measurement point with a measurement terminal and a second measurement point. If the temperature sensor, for example, is a temperature resistance, the first measurement point describes a first end and the second measurement point describes a second end of the temperature resistance. If the temperature sensor, for example, is a temperature diode, the first measurement point describes the anode and the second measurement point describes the cathode of the temperature diode. The second measurement point is electrically connected to the emitter electrode, so that a voltage which drops over the temperature sensor can be measured between the measurement terminal and the first emitter terminal for the temperature measurement.

It is achieved by this means that a voltage, which is proportional to the ambient temperature of the temperature sensor is measured between the measurement terminal and the first emitter terminal, wherein merely a single additional terminal, the measurement terminal, is required for the first measurement point. Furthermore, the temperature sensor can be arranged inside the power semiconductor element, which results in a space reduction.

Advantageously, according to one embodiment of the invention, the temperature sensor can be formed as a temperature diode with an anode and a cathode, wherein the cathode is connected to the emitter electrode. By this means, it is achieved that in the transmission region of the power semiconductor element, no collector current of the power semiconductor element can flow off via the temperature sensor or the temperature diode. Furthermore, the connection of the cathode of the temperature diode to the emitter electrode has the advantage that a gate driver actuating the gate electrode of the power semiconductor element and measurement electronics connected at the measurement terminal to determine at least the temperature by means of the temperature sensor can refer to a common ground potential (GND), which simplifies the measurement evaluation.

Advantageously, according to a further embodiment of the invention, the power semiconductor element and the temperature sensor can be arranged in a module, in particular the temperature sensor is integrated inside the power semiconductor element (i.e., for example mounted on the same die as the power semiconductor element) or is arranged on the power semiconductor element. By this means a space-saving design is achieved and the actual temperature or maximum temperature of the power semiconductor element is measured.

Advantageously, according to yet another embodiment of the invention, the emitter electrode can be electrically connected via at least one bond wire and/or one DCB (DCB: direct copper bond) conductor track to a second emitter terminal, wherein the first emitter terminal is electrically connected to the second emitter terminal and the at least one bond wire and/or one DCB conductor track has/have in each case an internal resistance R_bond, which is used as measurement resistance R_sense to determine a collector current or a load current of the power semiconductor element. It should be understood that the effective total measurement resistance R_sense can be composed of individual internal resistances R_bond of the at least one bond wire and/or the at least one DCB conductor track.

As a result, it is rendered possible that a collector current or load current controlled via the power semiconductor element can also be determined. By this means, it is achieved that only a single voltage measurement device is required for the temperature measurement and the current measurement, since the wiring of the temperature sensor described herein according to the invention makes it possible to measure the temperature and the collector or load current of the power semiconductor element at only one single measurement point, that is the measurement terminal.

In general, DCB conductor track can be understood as any type of conductor track for producing an electrical connection between two electrical components to be connected together electrically, in particular here also a conductor track which connects the emitter electrode electrically to the second emitter terminal, which is located, for example, on a direct-copper-bond or DCB substrate. Such a DCB substrate is used in a well-known manner for an electrical connection, external to the power semiconductor element, or an electrical wiring, external to the power semiconductor element, of the power semiconductor element. Other conductor track substrates other than a DCB substrate can naturally also be used. Since the first emitter terminal according to the present embodiment is electrically connected to the second emitter terminal, this means that the internal resistance of the at least one bond wire and/or of the at least one conductor track between the measurement terminal (first measurement point of the temperature sensor) and the first emitter terminal is electrically effective.

Advantageously, according to a further embodiment of the invention, a constant current source can be connected to the measurement terminal and a voltage measuring device can be connected between measurement terminal and first emitter terminal. In the case of the temperature diode which can be used as temperature sensor, the constant current source is therefore connected between the anode of the temperature diode and the first emitter terminal. Thus in an off-state of the power semiconductor element, a temperature-dependent voltage can be measured, and in a conducting state of the power semiconductor element, a load-current-dependent voltage can be measured.

Advantageously, according to yet another embodiment of the invention, the collector electrode can be electrically connected to a freewheeling cathode of a freewheeling diode and the emitter electrode can be electrically connected to a freewheeling anode of the freewheeling diode. When switching from the conducting state into the off-state of the power semiconductor element, this prevents any connected inductive load from producing a high voltage at the power semiconductor element and thus being able to damage it. Furthermore, in the presence of the freewheeling diode connected in parallel to the power semiconductor element, in addition to the already mentioned temperature and load current measurement of the power semiconductor element at merely a single measurement point (i.e., the measurement terminal) as a result of the wiring according to the invention of the temperature sensor described herein, the direction of flux or flow of the load current through the power semiconductor element can additionally also be detected by means of the measurement electronics connected to the measurement terminal. If, specifically, the power semiconductor element is in freewheeling mode, that is, a current flow of the collector or load current through the freewheeling diode takes place in its transmission direction, no change in the load-current-induced voltage drop over the measurement resistance R_sense between the conducting state and the off-state of the power semiconductor element can be detected. In other words, it can be concluded from the unchanged voltage drop at the measurement resistance R_sense in the off-state and in the conducting state of the power semiconductor element that the load current flows in the transmission direction of the freewheeling diode, from which the instantaneous flow direction of the load current is directly obtained.

Advantageously, according to a further embodiment of the invention, the freewheeling diode can be connected electrically in parallel to the power semiconductor element by means of DCB conductor tracks and/or bond wires. Thus, no bond wires which have an internal resistance, which adversely affects the measurement, are required.

Advantageously, according to a further embodiment of the invention, the power semiconductor element can be a normal-conducting IGBT with n-channel or a MOSFET transistor, in particular an SIC-MOSFET transistor.

According to a further aspect of the present invention, a bridge circuit is specified, which comprises at least one power semiconductor circuit according to one of the previously described embodiments according to the invention. This also makes it possible to determine the flow direction of a load current controlled by a power semiconductor element of the previously described power semiconductor circuit. Bridge circuit in the sense of the present invention is to be understood generally as a well-known electrical circuit, which is also known as H-circuit, H-bridge, or full bridge.

According to yet another aspect of the present invention, a method for determining a temperature, in particular excess temperature, of a power semiconductor element by means of a power semiconductor circuit according to one of the previously described embodiments is provided. The method comprises at least the following steps:

a) controlling power semiconductor element into the off-state, b) measuring a voltage V_f between measurement terminal and first emitter terminal as temperature voltage V_T, c) determining the temperature T as a function of the temperature voltage V_T.

As a result, it is achieved that the temperature of the power semiconductor element can be determined by means of only a single additional terminal, the measurement terminal.

Advantageously, according to one embodiment of the invention, a current can be additionally determined by means of the following steps:

d) determining the measurement resistance R_sense between emitter electrode and second emitter terminal, to which the first emitter terminal is electrically connected, e) storing the voltage V_f measured previously in the off-state of the power semiconductor element as stored temperature voltage V_T=V_f, f) controlling the power semiconductor element into the conducting state, g) measuring the voltage V_f between measurement terminal and first emitter terminal, h) determining the collector current i_c as a function of the voltage V_f measured in the conducting state of the power semiconductor element (20) and the stored temperature voltage V_T.

By this means, it is achieved that both the temperature and also the current can be determined by means of only a single voltage measuring device. The measurement resistance R_sense is formed by an internal resistance of at least one bond wire and/or at least one DCB conductor track, which is described hereinafter by R_bond. In this case, however, R_bond should not be interpreted to mean that only one bond wire or one conductor track is necessarily provided between emitter electrode and second emitter terminal. Accordingly, several internal resistances R_bond effective between the emitter electrode and the second emitter terminal are added to give a joint effective measurement resistance R_sense.

Advantageously, according to a further embodiment of the invention, the collector current i_c can be determined by means of the equation i_c=(V_f–V_T)/R_sense. By this means, an approximation of a source current is determined analytically. If no additional resistance is provided between emitter electrode and emitter terminal, R_sense=R_bond.

Advantageously, according to yet another embodiment of the invention, the temperature can be compared with a temperature threshold value. By this means, if the temperature threshold value is exceeded, an excess temperature can be detected.

Advantageously, according to a further embodiment of the invention, the current i_c can be compared with a current threshold value. By this means, if the current threshold value is exceeded, an excess current can be detected.

Advantageously, according to a further embodiment of the invention, in a bridge circuit comprising at least one power semiconductor circuit according to the invention and a freewheeling diode, the flow direction of a load current i_L can be determined by determining a voltage V_fs between measurement terminal and first emitter terminal in the off-state of the power semiconductor element and a voltage V_fl between measurement terminal and first emitter terminal in the conducting state of the power semiconductor element, forming the difference V_d=V_fl–V_fs, and, if V_d>0, determining that the load current i_L has the same sign as the collector current i_c and otherwise (e.g. V_d=0) that it has the opposite sign to the collector current i_c.

As has already been explained previously for the power semiconductor circuit according to the invention, a bridge circuit is not absolutely necessary for determining the flow direction of the load current i_c but rather it can be determined in the manner described in the preceding paragraph merely in the presence of a freewheeling diode connected in parallel to the power semiconductor component of the power semiconductor circuit according to the invention.

This has the advantage that the flow direction of a load current can be determined in addition to the temperature and load current measurement without additional measurement devices.

Further features and advantages of the invention are obtained from the following description of exemplary embodiments of the invention, which are not to be understood as restrictive, the invention being explained in detail hereinafter with reference to the drawings.

DETAILED DESCRIPTION

Hereinafter it is assumed for simplicity that the power semiconductor element is an IGBT. Naturally all other power semiconductor switches such as, for example, MOSFET transistors, field effect transistors, bipolar transistors, and thyristors should be considered in the same way. For the general description of the invention, the IGBT terms gate electrode, collector electrode, and emitter electrode are used.

In the various figures, parts that are equivalent with regard to their function are always provided with the same reference numbers so that these are usually only described once.

Figure 1:
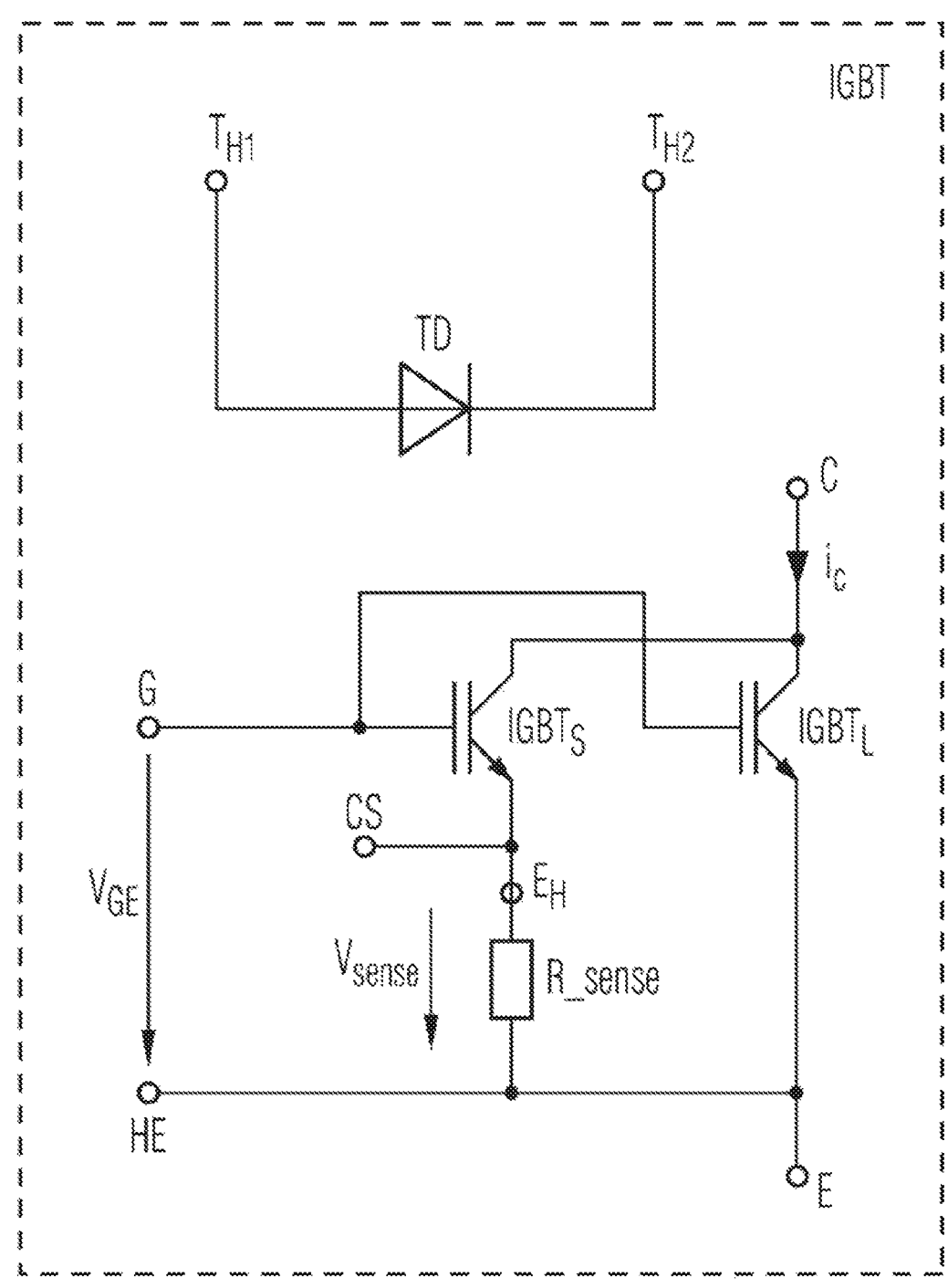
FIG. 1 shows a circuit diagram of a conventional TCS-IGBT with measurement resistance.

FIG. 1 shows a conventional TCS-IGBT. A portion of the cells of the IGBT is used for the current measurement (IGBT_S). The remaining cells are used as actual IGBT, which can be used for controlling a load (IGBT_L). The IGBT has an emitter electrode E and an auxiliary emitter electrode HE. The load to be controlled can be connected to the emitter electrode E. The auxiliary emitter electrode HE is used to measure the current flow. In this case, HE represents the ground or GND reference point of a gate driver (not shown) controlling a gate electrode G and of a measurement resistance R_sense. To this end, the measurement resistance R_sense is connected between the auxiliary emitter electrode HE and an emitter electrode EH of the IGBT_S, at which a voltage drop V_sense can be measured. This voltage drop is proportional to the current i_sense, which flows through the portion of the cells of the IGBT that is intended for the current measurement. This current is in turn proportional to the collector current i_c, which flows between collector C and emitter E of the TCS-IGBT. Furthermore the TCS-IGBT has a temperature diode TD which is galvanically separate from the IGBT. Via terminals TH1 and TH2 of the temperature diode TD, after connection, for example, of a current source, a voltage drop can be measured over the temperature diode TD, which voltage drop is proportional to the ambient temperature of the temperature diode TD and therefore also proportional to the ambient temperature of the IGBT. A conventional TCS-IGBT arranged on a substrate (printed circuit board) thus has at least the following seven terminals: a gate terminal G for connection of a control signal and a gate driver, an emitter terminal E for connection of a load, an auxiliary emitter terminal HE for connection of a measurement resistance R_sense and the gate driver, a collector terminal C for connection of a supply voltage, a current sensor terminal for connection of the measurement resistance R_sense and for measurement of the current flowing over it, and two terminals TH1 and TH2 for measuring the operating temperature T.

At least two voltage measurement devices are required for operation of a TCS-IGBT so that both the temperature T and also the collector current i_c can be determined.

Figure 2:
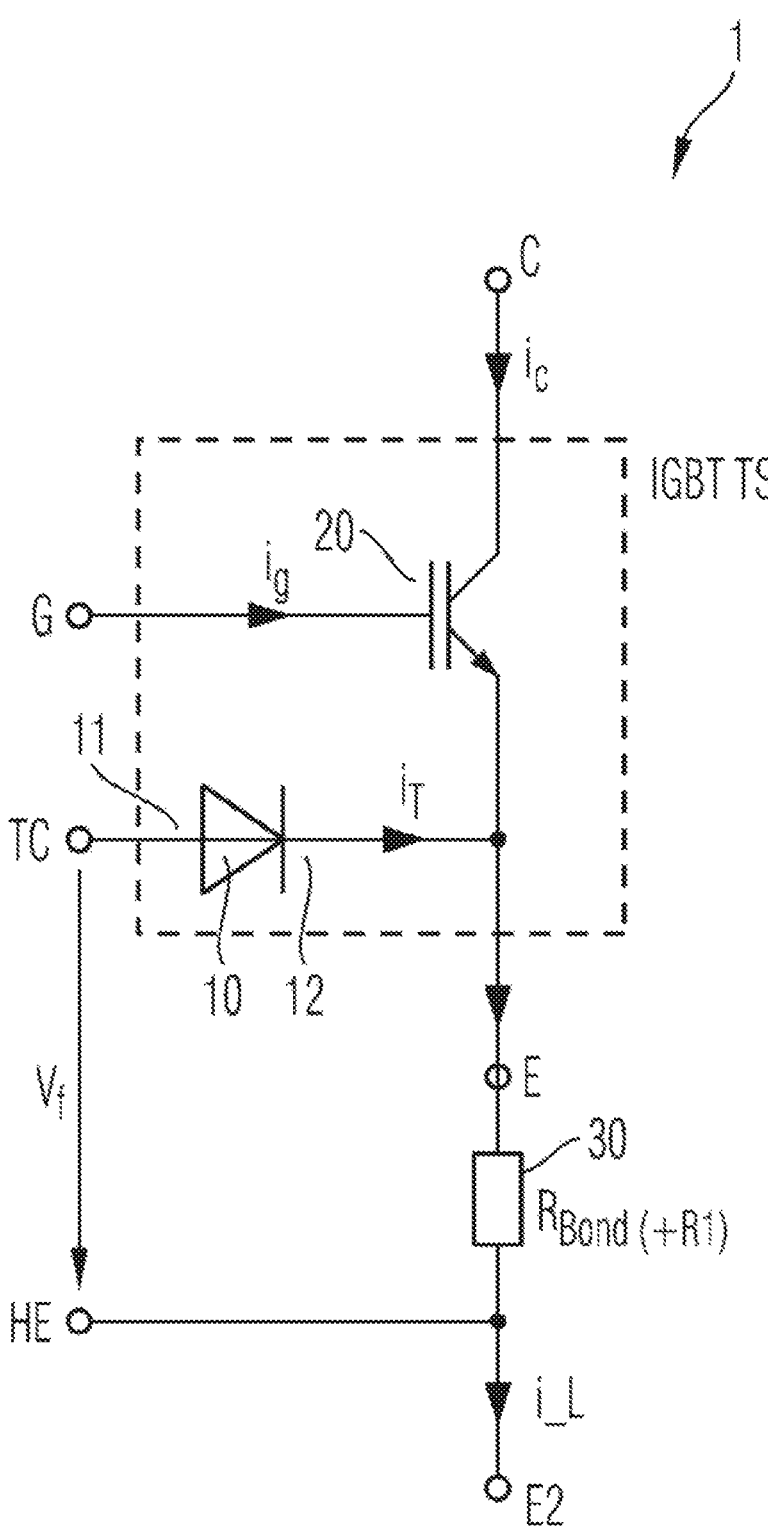
FIG. 2 shows a circuit diagram of an exemplary embodiment of a power semiconductor circuit according to the invention.

FIG. 2 shows an exemplary embodiment of a power semiconductor circuit 1 according to the invention. In this case, a temperature diode 10 is used to determine the temperature. For this purpose, the cathode 12 of the temperature diode is connected to the emitter electrode E of the power semiconductor element 20 designed as an IGBT. It is advantageous if the temperature diode 10 is integrated in the module of the IGBT 20 or directly in the IGBT 20. Alternatively, however, it is also possible to connect the temperature diode 10 as external component to the first emitter terminal HE of a standard IGBT module.

In the present exemplary embodiment, the temperature diode 10 is integrated in the IGBT 20, which is intended be illustrated by the dashed framing of the IGBT 20. The IGBT chip of this exemplary embodiment is hereinafter designated by IGBT-TS and has at least the following electrodes: a gate electrode G for controlling the gate of the IGBT 20, a collector electrode C, an emitter electrode E. Furthermore, the IGBT-TS has a temperature diode 10, which comprises a first measurement point—the anode 11—and a second measurement point—the cathode 12. The anode 11 has a measurement terminal TC, to which a current source and also a voltage measurement device can be connected.

The measurement terminal TC is connected to the anode 11 of the temperature diode 10. By this means, the temperature diode 10 can be supplied with a constant current i_T. Since the cathode 12 of the temperature diode 10 is electrically connected to the emitter electrode E of the IGBT-TS, when a current source is connected to the measurement terminal TC, a current flows through the temperature diode 10 to the first emitter terminal HE of the IGBT-TS. The ambient temperature T of the temperature diode 10, that is in the present case directly the chip temperature of the IGBT 20, can then be determined by means of a voltage measurement between the first measurement terminal TC and the first emitter terminal HE. For this purpose, it is necessary that the IGBT-TS is located in its off-state, since then no collector current i_c flows, which would be superposed on the emitter electrode E with the constant current i_T. The collector-current-induced (i_c) voltage drop at an internal resistance R_bond of at least one bond wire and/or at least one (DCB) conductor track as a result of the connection of the emitter electrode E to a second emitter terminal E2 would be added in such a case to the voltage drop at R_bond caused by the constant current i_T.

The voltage drop V_f at the temperature diode 10 can be determined by means of a voltage measurement between the first measurement terminal TC and the first emitter terminal HE in the off-state of the IGBT-TS, from which voltage drop the temperature T of the IGBT 20 can then be inferred. Since the main task of the IGBT-TS is switching a load, the IGBT-TS has a first emitter terminal HE for connection of the voltage measuring device and the second emitter terminal E2 for connection of the load. This is not problematic since a voltage measurement device (not shown) connected to the first emitter terminal HE is high-resistance or galvanically separated and consequently, almost no current flows via the first emitter terminal HE. The first emitter terminal HE consequently does not influence a load connected to the second emitter terminal E2.

In the exemplary embodiment of the power semiconductor circuit 1 shown in FIG. 2, the second emitter terminal E2 forms a connection node or link node of the emitter electrode Eon an external conductor track substrate, for example DCB substrate, for the external electrical connection or the external electrical wiring of the IGBT-TS. As can be further gathered from FIG. 2, for this purpose the emitter electrode E is electrically connected, for example, via one or more bond wires and/or via one or more DCB conductor tracks to the second emitter terminal E2, wherein the at least one bond wire and/or the at least one DCB conductor track comprises or comprise an internal resistance R_bond, as is illustrated by a resistance 30 in FIG. 2.

It can be further gathered from FIG. 2 that the first emitter terminal HE is electrically (e.g. directly) connected to the second emitter terminal E2. In other words, the internal resistance 30 is thus electrically effective between the measurement terminal TC and the first emitter terminal HE and is thus connected in series with the temperature diode 10 in relation to TC and HE.

A temperature T of the IGBT 20 is determined from the measured voltage V_f by means of a characteristic and compared with a threshold value T_th. Should the determined temperature T lie above the threshold value T_th, an excess temperature is inferred and precautionary measures are taken to protect the IGBT-TC. These can range from throttling the load current to completely shutting off the load.

When the IGBT-TS is switched into its conducting state, the collector current i_c, which flows between collector electrode C and emitter electrode E, can be additionally determined at the first emitter terminal HE. For this purpose, the collector current i_c is measured as the voltage drop at R_bond. If the current flowing via the first emitter terminal HE to the voltage measurement device (not shown) is disregarded, the load current i_L, which is composed of the sum of collector current i_c and temperature diode current i_T, flows between the emitter electrode E and the second emitter terminal E2 of the IGBT 20. Since the collector current i_c is many times higher than the gate current i_g and the temperature diode current i_T, the last two are negligible and the load current therefore almost corresponds to the collector current: i_L≈i_c. Since the gate current i_g merely flows at the time of the switch-on and the switch-off process of the IGBT 20 and in the present case no measurement is provided at the measurement terminal TC at these time points, the gate current i_g here is even completely irrelevant. The load current i_L or the collector current i_c flows between the electrode E and the second emitter terminal E2 through the resistance R_bond or 30, so that the voltage drop caused hereby at this resistance can be measured at the terminals TC and HE and the collector current i_c can be determined in this way.

The emitter electrode E and the second emitter terminal E2 are connected to one another via at least one bond wire and/or at least one DCB conductor track, which has/have an internal electrical resistance R_bond. If the resistance R_bond of the bond wire and/or the DCB conductor track is determined in advance and if no additional, pre-determinable measurement resistance R1 is set between the emitter electrode E and the second emitter terminal E2, the internal electrical resistance R_bond or 30 is used as a measurement resistance for the current flow: R_sense=R_bond.

However, an additional pre-determinable measurement resistance R1 can also be set between the emitter electrode E and the second emitter terminal E2 so that the measurement resistance for the current flow between the emitter electrode E and the second emitter terminal E2 is obtained as R_sense=R_bond+R1. Such a possible configuration of the power semiconductor circuit 1 is indicated in FIG. 2 by the reference number R1 in parentheses.

Particularly preferably in this case, R1 is selected to be very much higher than R_bond: R1>>R_bond, which is why it then holds approximately that R_sense=R1. A previous measurement of the internal resistance R_bond of the bond wire or the conductor track is then no longer necessary. For a more precise measurement of the current flow between the emitter electrode E and the second emitter terminal E2, however, it can also be advantageous to determine the sum of the internal resistance R_bond and the additional measurement resistance R1: R_sense=R1+R_bond. In the following analysis, the additional measurement resistance R1 is dispensed with.

The collector current i_c can be inferred by means of a voltage measurement between the measurement terminal TC and the first emitter terminal HE of the IGBT 20 in its conducting state. For this purpose, in a previous off-state of the IGBT 20, the temperature-dependent voltage V_f of the temperature diode 10 is determined and stored as temperature voltage V_T. Then in the conducting state of the IGBT 20, the voltage V_f is measured again and the previously stored temperature voltage V_T is subtracted. If the temperature increase at the IGBT 20 during its conducting state is disregarded, the difference V_f–V_T is proportional to the load current i_L and therefore approximately to the collector current i_c:

$$i\_c \approx (V\_f - V\_T)/R\_sense = (V\_f - V\_T)/R\_bond. \quad (1)$$

The measured collector current i_c is compared with a current threshold value i_th. Should the measured collector current i_c lie above the threshold value i_th, an excess current is inferred and precautionary measures are taken to protect the IGBT-TC. These can range from throttling the load current to completely switching off the load.

Alternatively, the load current i_L can also be determined by means of the above equation:

$$i\_L = (V\_f - V\_T)/R\_sense = (V\_f - V\_T)/R\_bond. \quad (2)$$

If therefore in particular a connected load needed to be protected from a too-high current flow, this could also be accomplished via an IGBT-TS according to the invention.

During operation the IGBT-TS can, for example, be wired with a microcontroller or an operation amplifier circuit (neither shown), which controls the gate electrode by means of a voltage output and optionally a gate driver. For this purpose, it can be necessary to provide a galvanic separation. Furthermore, the microcontroller can provide the constant current source for the temperature diode 10 and measure the voltage V_f by means of a voltage measurement device. Since microcontrollers usually only have voltage outputs, an additional wiring which forms a constant current source from a voltage output of the microcontroller, is possibly necessary. When using microcontrollers with pure digital outputs, one or more digital-analog converters (DA converters) can additionally be provided for this purpose. Via an internal control structure of the microcontroller, measures can then be carried out in real time, which protect the IGBT-TS from excess current and/or excess temperature.

The constant current or diode current i_T impressed into the temperature diode 10 need not necessarily be regulated with a microcontroller. On the contrary, a suitable operation amplifier circuit or a constant current source can also be provided for this purpose.

Figure 3:
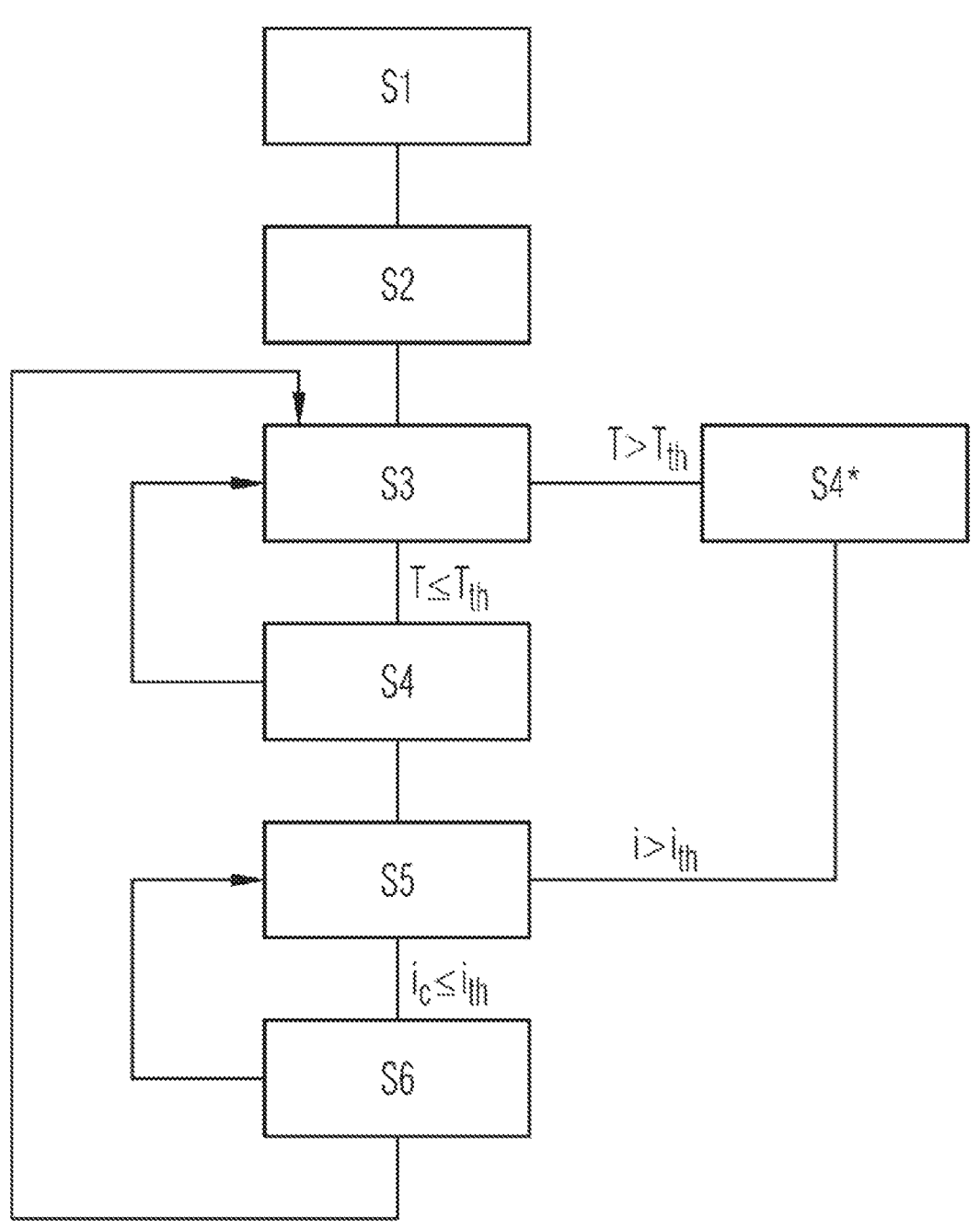
FIG. 3 shows a flow diagram of an exemplary embodiment of a method according to the invention.

FIG. 3 shows a flow diagram of an exemplary embodiment of a method according to the invention.

In a first step S1 before starting up the IGBT-TS, the measurement resistance R_sense between the emitter electrode E and the second emitter terminal E2 or the first emitter terminal HE connected thereto is determined, which resistance is based on a nonideal bond wire and/or a nonideal DCB conductor track.

In a second step S2, the IGBT-TS is started up and the IGBT-TS is switched to the off-state.

In a third step S3 the temperature T of the IGBT 20 is determined and the corresponding measured voltage V_f is stored in a memory as temperature voltage V_T. The temperature T is compared with a threshold value T_th. If the temperature T lies below the threshold value T_th, the method goes on to a fourth step S4. Otherwise, a protective measure is carried out to protect the IGBT-TS (step S4*).

As long as the IGBT-TS is still operated in its off-state switched to in step S2, step S4 brings about a return to step S3, otherwise, that is as soon as the IGBT-TS is transferred into its conducting state, the method goes on to a fifth step S5.

In the fifth step S5 the voltage V_f in the conducting state of the IGBT-TS is measured again and the collector current i_c is calculated by means of the above-specified equation 1. The determined collector current i_c is compared with a current threshold value i_th. If the collector current i_c lies below the threshold value i_th, the method goes on to a sixth step S6. Otherwise, a protective measure is carried out to protect the IGBT-TS (see step S4*).

As long as the IGBT-TS is still operated in its conducting state controlled from step S5, step S6 brings about a return to step S5, otherwise, that is as soon as the IGBT-TS is transferred into its off-state, the method goes back to step S3.

Figure 4:
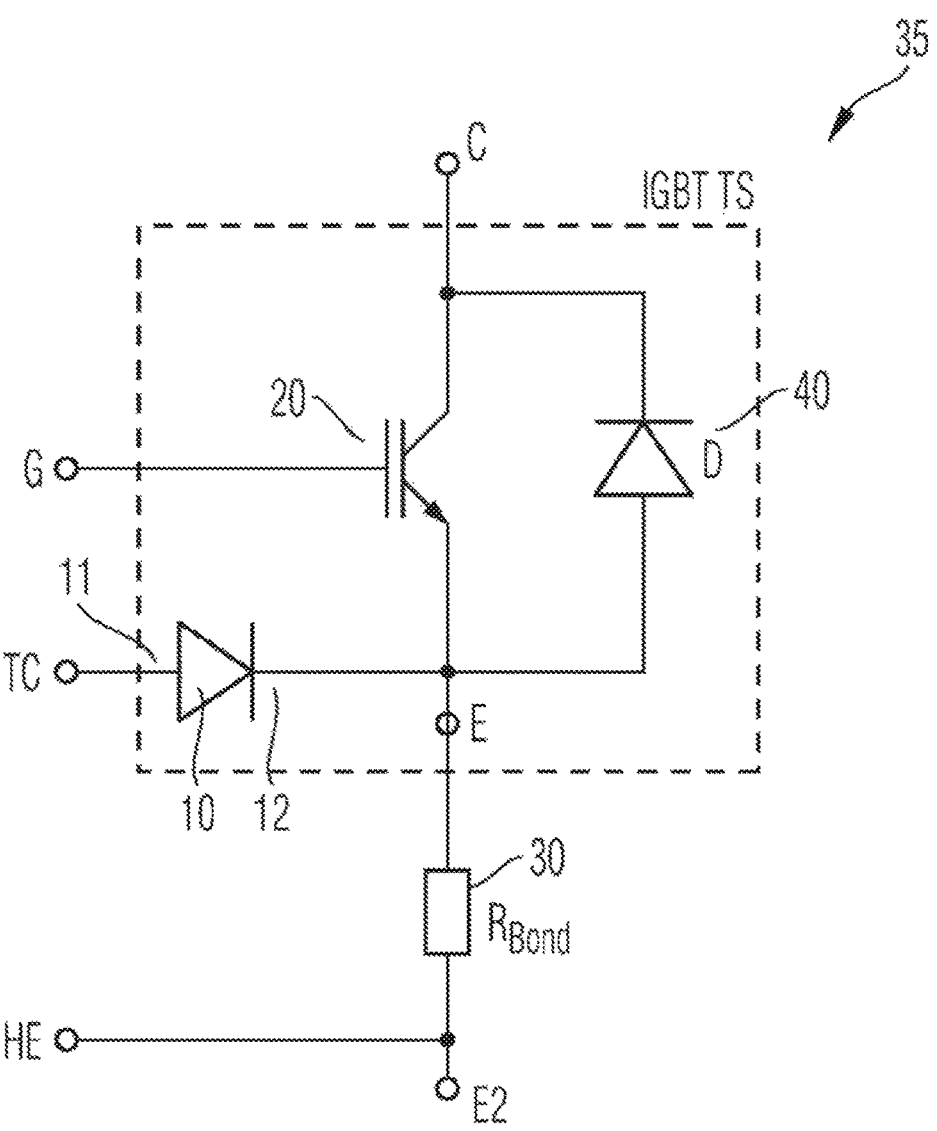
FIG. 4 shows a circuit diagram of a further exemplary embodiment of a power semiconductor circuit with a power semiconductor element with freewheeling diode according to the invention.

FIG. 4 shows a circuit diagram of a further exemplary embodiment of a power semiconductor circuit 35 with the power semiconductor element 20, e.g. an IGBT, with freewheeling diode 40 according to the invention. The freewheeling diode 40 is connected in parallel to the collector electrode C and emitter electrode E. The cathode of the freewheeling diode 40 (freewheeling cathode) is connected to the collector electrode C and the anode of the freewheeling diode (freewheeling anode) is connected to the emitter electrode E of the IGBT 20. In this case, the freewheeling diode 40 can be integrated in the IGBT-TS, is located in a module with the IGBT-TS, or is connected in parallel as external component. In the exemplary embodiment shown in FIG. 4, the freewheeling diode 40 is integrated in the IGBT-TS, as is intended to be indicated by a dashed framing of the IGBT-TS. However, this is not absolutely necessary.

The freewheeling diode 40 prevents inter alia that, when an inductive load connected to the IGBT-TS is switched off, a high voltage is produced at the IGBT-TS, which could possibly therefore be damaged. The freewheeling diode 40 ensures that the induced current of the switched-off load can flow via the freewheeling diode 40 so that an opposite current flow of the emitter current to normal operation results.

A further advantage of the power semiconductor circuit 35 according to the invention is obtained if said circuit including a freewheeling diode 40 is integrated in a bridge circuit, for example an H-circuit, H-bridge, or full bridge. For example, the current direction of the load current i_L can be determined by means of the bridge circuit. However, the bridge circuit is not absolutely essential for this, as has already been described previously.

Figure 5:
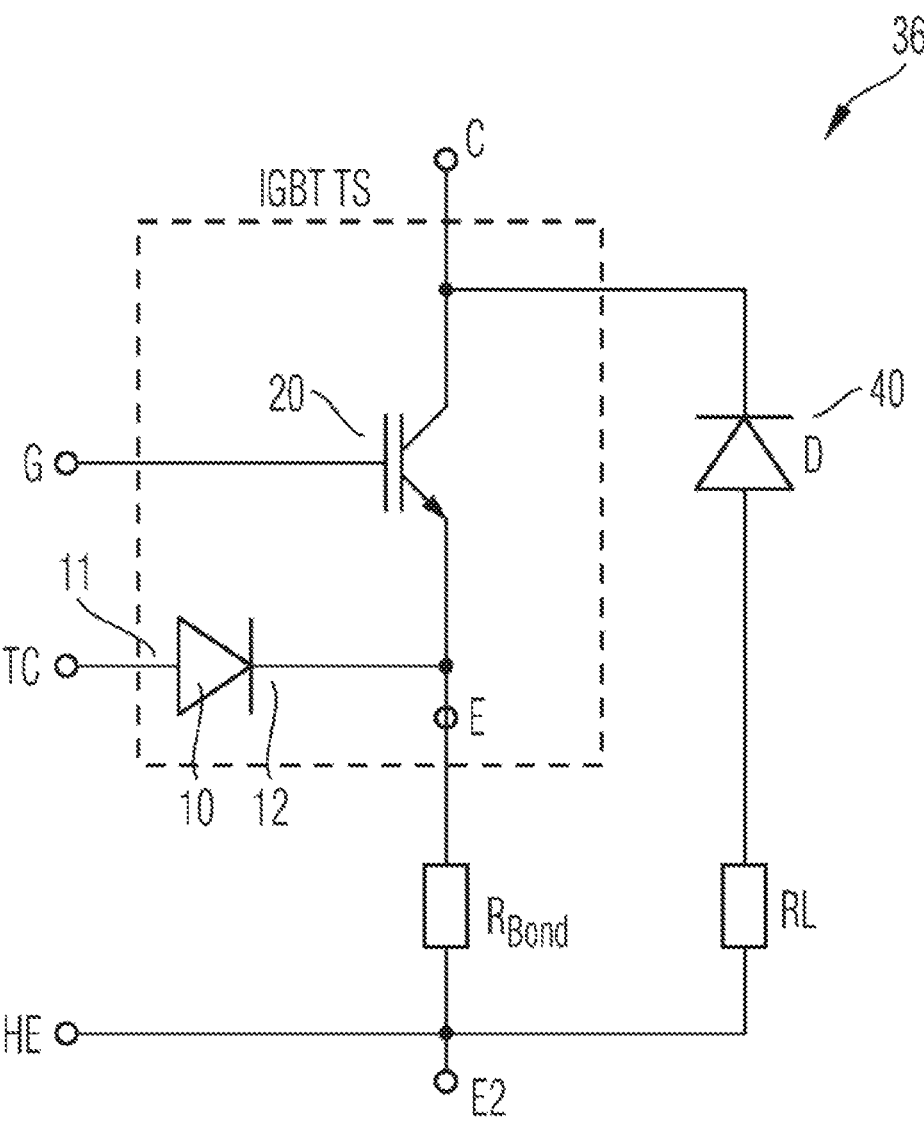
FIG. 5 shows a circuit diagram of yet another exemplary embodiment of a power semiconductor circuit with a power semiconductor element with freewheeling diode according to the invention.

FIG. 5 shows a circuit diagram of yet another exemplary embodiment of a power semiconductor circuit 36 with the power semiconductor element 20 (IGBT) having a freewheeling diode 40 according to the invention. Unlike the power semiconductor circuit 35 of FIG. 4, in the power semiconductor circuit 36 of FIG. 5 the freewheeling diode 40 with its anode is not directly connected to the emitter electrode E of the IGBT 20 but to the second emitter terminal E2, which, for example, is arranged on a DCB substrate for external wiring of the IGBT-TS. Thus, the freewheeling diode 40 of the power semiconductor circuit 36 is also not integrated in the IGBT-TS but is wired externally with it, which is intended to be indicated by the dashed framing which does not include the freewheeling diode 40. Accordingly, in the circuit branch containing the freewheeling diode 40, a conductor track resistance RL of the (external) conductor track, which electrically connects the anode of the freewheeling diode 40 to the second emitter terminal E2 on the DCB substrate, is effective.

Figure 6:
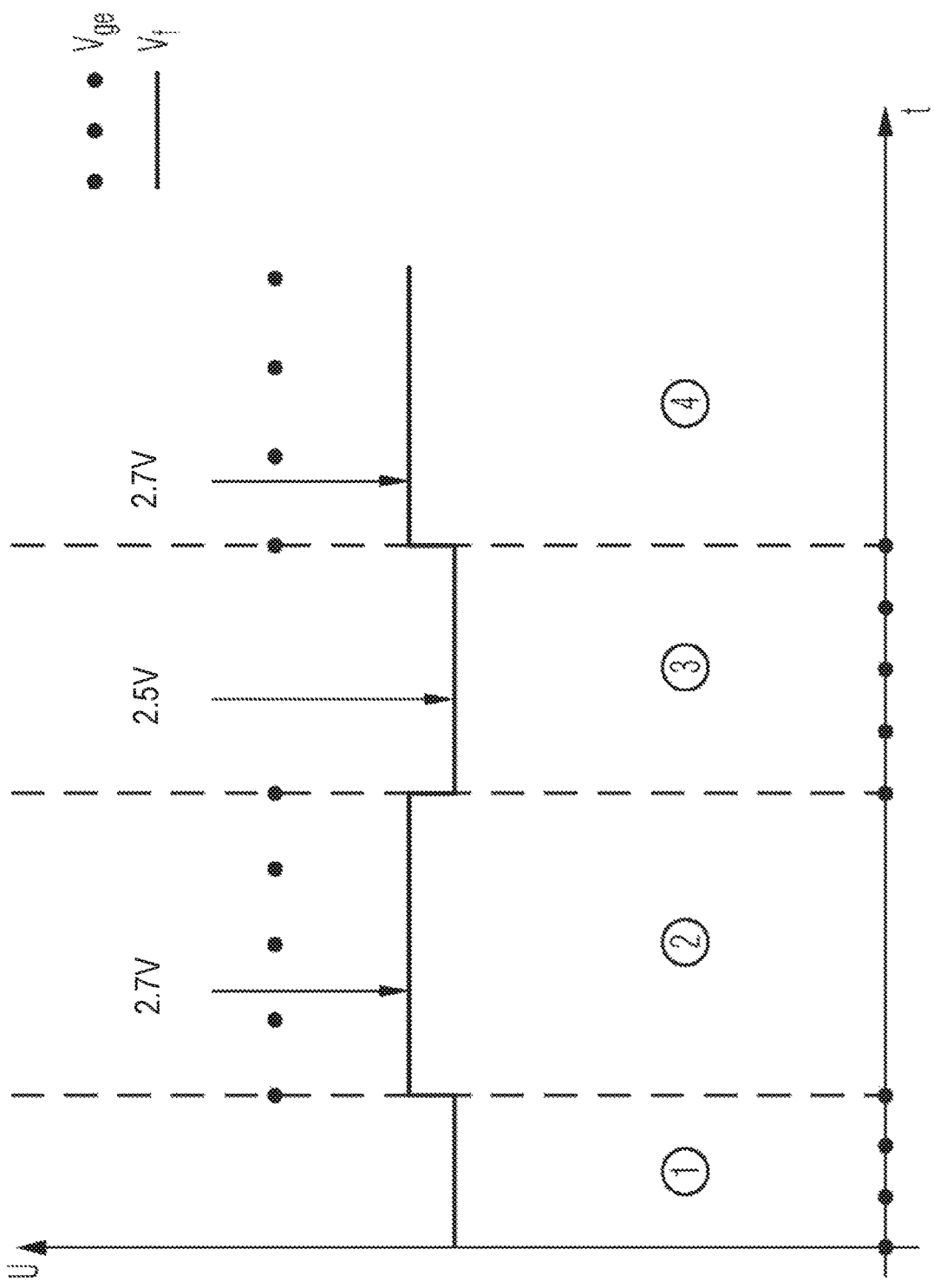
FIG. 6 shows exemplary voltage profiles of a power semiconductor circuit according to the invention.

FIG. 6 shows exemplary current and voltage profiles of the temperature diode 10 of a power semiconductor circuit 36 according to the invention as shown for example in FIG. 5. If the IGBT-TS shown there is in the conducting state (i.e. a voltage V_ge is applied between gate electrode G and first emitter terminal HE or second emitter terminal E2, and the IGBT-TS connects through), the voltage V_f measured between the measurement terminal TC and the first emitter terminal HE is obtained as the sum of the voltage drops through the temperature diode 10 and the voltage obtained from the product of load current i_L and measurement resistance R_sense. This conducting state of the IGBT-TS is characterized in FIG. 6 by the regions 2 and 4. In the present example, the sum of the voltages there is about 2.7 V. In the off-state of the IGBT-TS only the voltage drop at the temperature diode 10 is measured, which is in this case about 2.5 V (regions 1 and 3). The voltage difference 2.7 V−2.5 V=0.2 V corresponds to the load current.

If the IGBT-TS shown in FIG. 5, for example, is now located in a bridge circuit, for example, an H-circuit, H-bridge, or full bridge, the case can arise where the IGBT-TS is switched in the conducting state and at the same time a current flows via the freewheeling diode 40. In this case, no collector current i_c flows and thus there is also no voltage drop over the measurement resistance R_sense (here equal to R_bond). The measured voltage V_f between TC and HE then corresponds to the same voltage as in the off-state of the IGBT 20 (in the present example 2.5 V). Thus, it can be concluded that the load current i_L has an opposite sign to the collector current i_c.

As has already been described elsewhere herein, the current direction of the load current i_L in an IGBT-TS with freewheeling diode 40 can be generally determined by a comparison of the voltages V_f measured between TC and HE during the off-state and the conducting state of the IGBT 20. If no voltage change of the measured voltages V_f can be detected between the off-state and the conducting state, the IGBT-TS is freewheeling, that is the load current flows in the transmission direction through the freewheeling diode 40, with the result that a first current direction is unambiguously specified. If, however, a voltage change of the measured voltages V_f is measured between the off-state and the conducting state of the IGBT 20, the IGBT-TS is not freewheeling and the current direction of the load current then switched by the IGBT 20 is opposite to the freewheeling current direction. A bridge circuit as mentioned previously is therefore not absolutely essential to detect the current direction of the load current i_L.

Figure 7A:
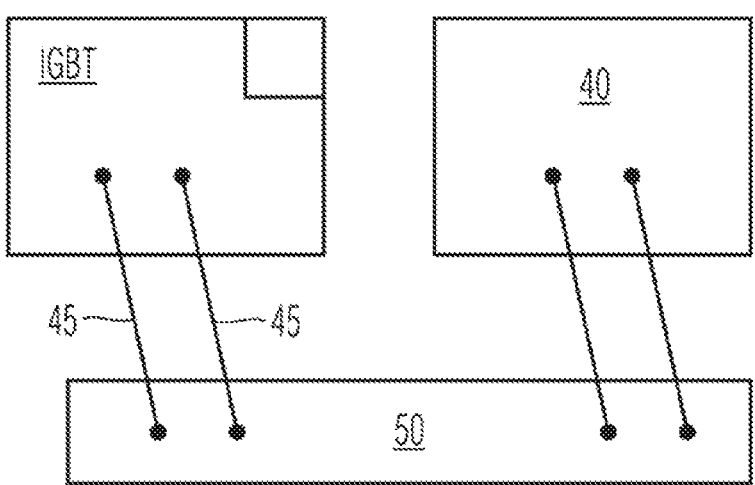
FIG. 7A shows a comparison of an ideal electrical connection of a power semiconductor element and a freewheeling diode.
Figure 7B:
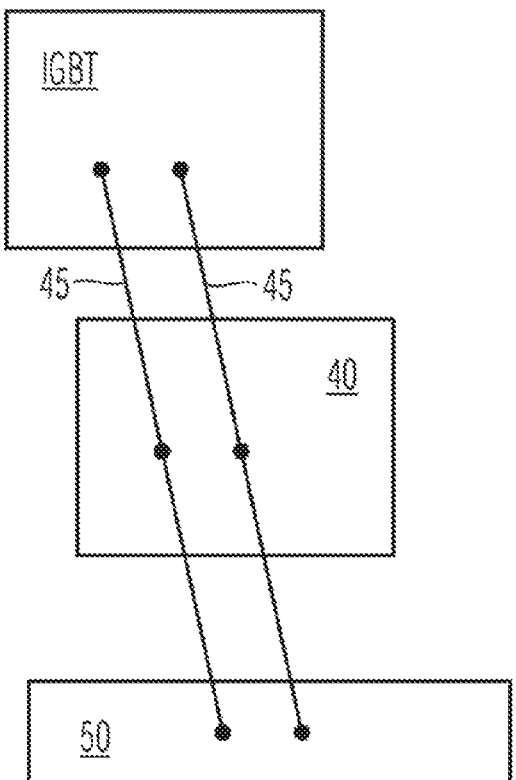
FIG. 7B shows a comparison of a nonideal electrical connection of a power semiconductor element and a freewheeling diode.

FIG. 7A shows a wiring of IGBT-TS and freewheeling diode 40 designated herein as ideal, and FIG. 7B shows a wiring thereof designated herein as nonideal. In the ideal case of FIG. 7A, the freewheeling diode 40 is connected in parallel to the IGBT 20 via conductor tracks 50, for example DCB conductor tracks of a DCB substrate externally connecting the IGBT-TS, whose internal resistance in FIG. 5 corresponds to the resistance RL shown there, and not directly via bond wires 45, as is indicated by FIG. 7B for the nonideal case. Thus, the freewheeling current through the freewheeling diode 40 in the ideal case of FIG. 7A does not produce an additional voltage drop via the bond wires 45, whose internal resistance corresponds to the resistance R_bond in FIGS. 2, 4, and 5, and does not influence the measurement of the voltage V_f. Thus, the schematic diagram in FIG. 7A corresponds to the circuit diagram of the power semiconductor circuit 36 shown in FIG. 5. The diagram in FIG. 7B corresponds to the circuit diagram of the power semiconductor circuit 35 shown in FIG. 4.

It should be noted at this point that the nonideal wiring as shown in FIG. 7B can certainly be used when using a MOSFET as power semiconductor component 20 as a result of the body diode integrated in the MOSFET itself.

If the power semiconductor element 20 is a MOSFET transistor, the entire preceding description applies in corresponding manner. It is pointed out here that the collector electrode described for MOSFET transistors is usually designated as drain electrode and the emitter electrode is usually designated as source electrode. Accordingly, the first and second emitter terminals described above are correspondingly first and second source terminals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for determining a temperature of a power semiconductor element using a power semiconductor circuit that comprises: the power semiconductor element comprising a gate electrode configured to actuate the power semiconductor element and electrically connected to a gate terminal, a collector electrode, and an emitter electrode electrically connected to both a first emitter terminal and a second emitter terminal that is separate from the first emitter terminal; and a temperature sensor comprising a first measurement point with a measurement terminal that is separate from the gate terminal and a second measurement point electrically connected to the emitter electrode, so that a voltage which drops over the temperature sensor is measurable between the measurement terminal and the first emitter terminal for the temperature measurement, the method comprising:

controlling the power semiconductor element into an off-state;

measuring a voltage between the measurement terminal and the first emitter terminal as a temperature voltage;

determining the temperature of the power semiconductor element as a function of the temperature voltage, determining an internal resistance as a measurement resistance between the emitter electrode and a second emitter terminal to which the first emitter terminal is electrically connected;

storing the voltage previously measured in the off-state of the power semiconductor element as a stored temperature voltage;

controlling the power semiconductor element into a conducting state;

measuring the voltage between the measurement terminal and the first emitter terminal in the conducting state; and determining a collector current of the power semiconductor element as a function of the voltage measured in the conducting state of the power semiconductor element and the stored temperature voltage.

2. The method of claim 1, wherein the collector current is determined by $i\_c=(V\_f-V\_T)/R\_sense$, where $i\_c$ is the collector current, $V\_f$ is the voltage measured in the conducting state of the power semiconductor element, $V\_T$ is the stored temperature voltage, and $R\_sense$ is a joint effective measurement resistance.

3. The method of claim 1, further comprising:

comparing the collector current with a current threshold value; and inferring an excess current based on the comparison.

4. The method of claim 1, further comprising:

comparing the temperature with a temperature threshold value; and inferring an excess temperature based on the comparison.

5. A method for determining a sign of a load current in a bridge circuit that comprises: a power semiconductor element comprising a gate electrode configured to actuate the power semiconductor element, a collector electrode, and an emitter electrode electrically connected to a first emitter terminal; and a temperature sensor comprising a first measurement point with a measurement terminal and a second measurement point electrically connected to the emitter electrode, so that a voltage which drops over the temperature sensor is measurable between the measurement terminal and the first emitter terminal for the temperature measurement, the method comprising:

determining a voltage between the measurement terminal and the first emitter terminal in an off-state of the power semiconductor element;

determining a voltage between the measurement terminal and the first emitter terminal in a conducting state of the power semiconductor element; and if the difference between the voltage measured in the off-state and the voltage measured in the conducting state is greater than zero, determining that a load current in the bridge circuit has a same sign as a collector current of the power semiconductor element, and otherwise determining that the load current has the opposite sign to the collector current.

\*   \*   \*   \*   \*